(12) United States Patent
Kuroda

(10) Patent No.: US 10,916,285 B2
(45) Date of Patent: Feb. 9, 2021

(54) SEMICONDUCTOR STORAGE DEVICE, INFORMATION PROCESSING APPARATUS, AND REFERENCE POTENTIAL SETTING METHOD

(71) Applicant: Sony Semiconductor Solutions Corporation, Kanagawa (JP)

(72) Inventor: Masami Kuroda, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/489,155

(22) PCT Filed: Feb. 6, 2018

(86) PCT No.: PCT/JP2018/004064
§ 371 (c)(1),
(2) Date: Aug. 27, 2019

(87) PCT Pub. No.: WO2018/159234
PCT Pub. Date: Sep. 7, 2018

(65) Prior Publication Data
US 2019/0392880 A1    Dec. 26, 2019

(30) Foreign Application Priority Data
Mar. 3, 2017   (JP) .................................. 2017-040739

(51) Int. Cl.
*G11C 11/16*     (2006.01)
*G11C 7/06*      (2006.01)

(52) U.S. Cl.
CPC ............ *G11C 11/1673* (2013.01); *G11C 7/06* (2013.01); *G11C 11/1697* (2013.01)

(58) Field of Classification Search
CPC ... G11C 11/1673; G11C 7/06; G11C 11/1697; G11C 7/14; G11C 11/16; G11C 13/00
See application file for complete search history.

(56) References Cited

U.S. PATENT DOCUMENTS

| | | | |
|---|---|---|---|
| 2013/0044535 A1* | 2/2013 | Shimakawa | G11C 7/14 365/148 |
| 2014/0185401 A1* | 7/2014 | Yang | G11C 7/14 365/207 |
| 2017/0365336 A1* | 12/2017 | Lin | G11C 13/004 |

FOREIGN PATENT DOCUMENTS

| JP | 2009-238327 A | 10/2009 |
|---|---|---|
| JP | 2016-4589 A | 1/2016 |

* cited by examiner

*Primary Examiner* — Jerome Leboeuf
(74) *Attorney, Agent, or Firm* — Michael Best & Friedrich LLP

(57) ABSTRACT

A semiconductor storage device is provided, the semiconductor storage device including: a resistance element configured to generate a reference potential to be supplied to a sense amplifier; and a switch unit having at least two states including a state in which the reference potential to be supplied to the sense amplifier is generated by injection of a current to the resistance element, and a state in which a reference potential generated outside the semiconductor storage device is supplied to the sense amplifier.

16 Claims, 10 Drawing Sheets

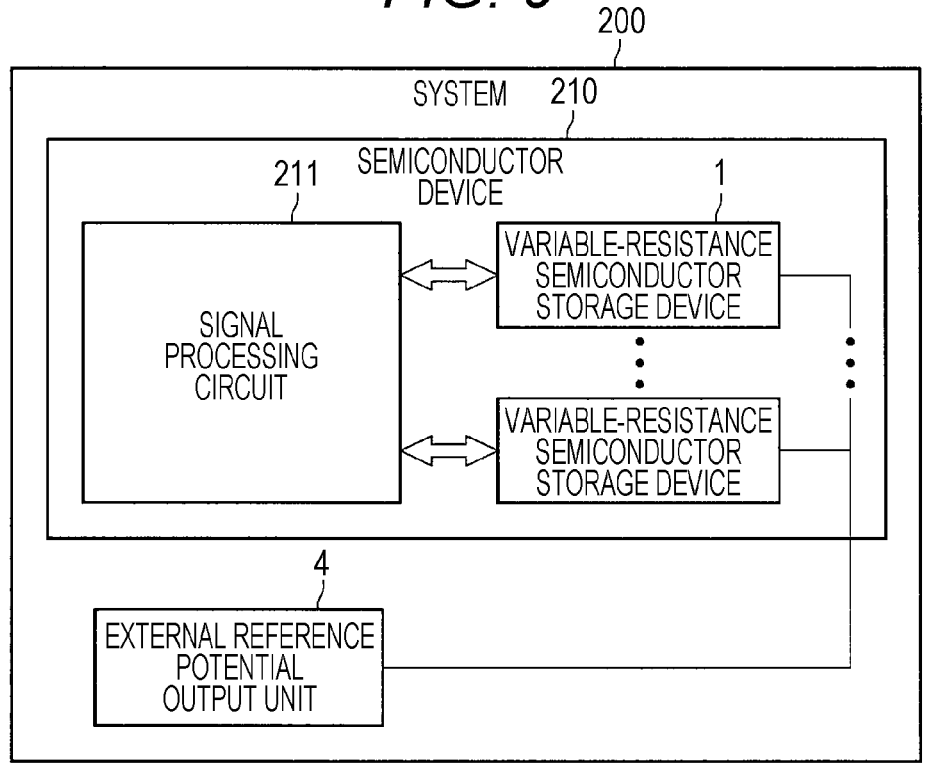
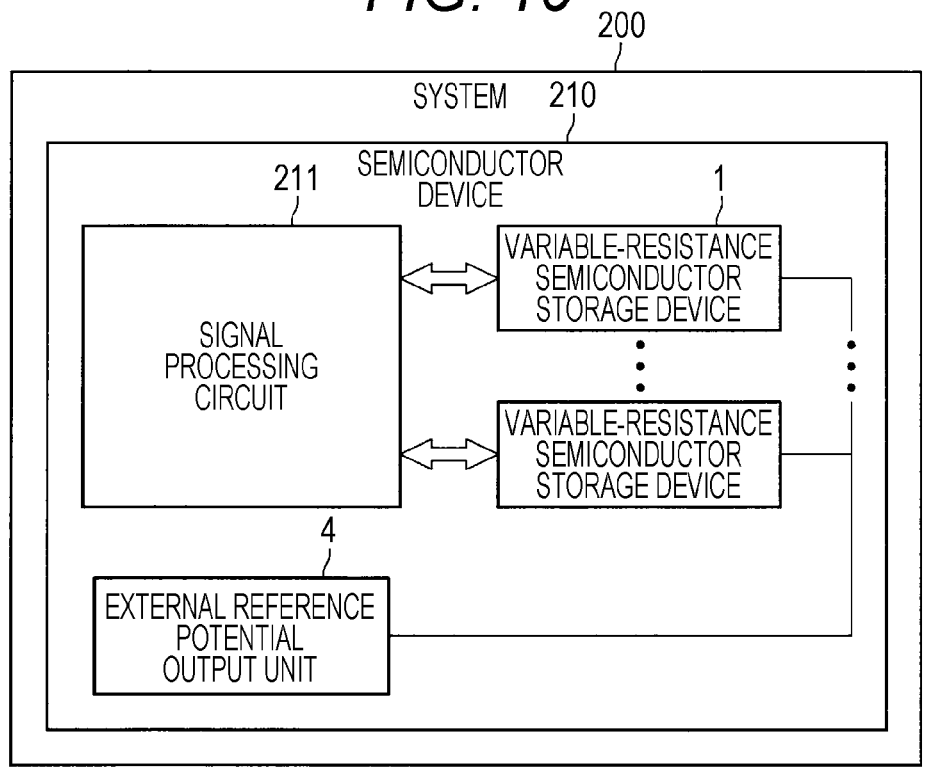

SEMICONDUCTOR STORAGE DEVICE, INFORMATION PROCESSING APPARATUS, AND REFERENCE POTENTIAL SETTING METHOD

TECHNICAL FIELD

The present disclosure relates to a semiconductor storage device, an information processing apparatus, and a reference potential setting method.

BACKGROUND ART

A variable-resistance semiconductor storage device includes a storage element constituted by at least one variable-resistance storage element which stores at least binary information on the basis of an electric resistance value. Further, the variable-resistance semiconductor storage device flows a current to a selected storage element and detects a value of a voltage applied to an electrical resistor of the storage element, by using a sense amplifier, to read a logical value stored in the storage element. In addition, the storage element of the variable-resistance semiconductor storage device has characteristics that when a voltage of a threshold or more is applied, a change to a high resistance or a low resistance occurs according to a direction of the applied voltage. Therefore, the variable-resistance semiconductor storage device requires reading at a voltage no higher than the threshold voltage. Furthermore, there is a need to prepare, for reference, an intermediate value of two resistance values for identifying a resistance value of the storage element, and for example, a semiconductor storage device in which two storage elements with a high resistance value and a low resistance value, respectively, are arranged in parallel and an average value of the resistance values is obtained has been disclosed (Patent Documents 1 and 2, or the like).

CITATION LIST

Patent Document

Patent Document 1: Japanese Patent Application Laid-Open No. 2016-4589
Patent Document 2: Japanese Patent Application Laid-Open No. 2009-238327

SUMMARY OF THE INVENTION

Problems to be Solved by the Invention

However, the storage elements for reference require a high reliability. Furthermore, it is known that a read disturb phenomenon in which a value is changed by a current applied for reading, and a data retention error occur in the variable-resistance storage element with a certain probability, and there is a possibility that a reliability at the time of reading data is decreased in a case of using the variable-resistance storage element for reference.

In this regard, the present disclosure suggests a novel and improved semiconductor storage device which is capable of setting a reference potential with a high reliability, an information processing apparatus, and a reference potential setting method.

Solutions to Problems

According to the present disclosure, a semiconductor storage device is provided, the semiconductor storage device including: a resistance element configured to generate a reference potential to be supplied to a sense amplifier; and a switch unit having at least two states including a state in which the reference potential to be supplied to the sense amplifier is generated by injection of a current into the resistance element, and a state in which a reference potential generated outside the semiconductor storage device is supplied to the sense amplifier.

Furthermore, according to the present disclosure, an information processing apparatus including at least one semiconductor storage device described above is provided.

Furthermore, according to the present disclosure, a reference potential setting method is provided, the reference potential setting method including: switching between at least two states including a state in which a reference potential to be supplied to a sense amplifier is generated by injection of a current into a resistance element, and a state in which a reference potential generated outside a semiconductor storage device is supplied to the sense amplifier, the resistance element being configured to generate the reference potential to be supplied to the sense amplifier.

Effects of the Invention

As described above, according to the present disclosure, it is possible to provide the novel and improved semiconductor storage device which is capable of setting a reference potential with a high reliability, the information processing apparatus, and the reference potential setting method.

Note that effects of the present disclosure are not necessarily limited to the effects described above, and, along with or instead of the effects described above, any of the effects shown in the present specification, or other effects that can be grasped from the present specification may be achieved.

BRIEF DESCRIPTION OF DRAWINGS

FIG. 9 is an explanatory diagram illustrating an example of a configuration of a system including the semiconductor storage device according to the embodiment.

FIG. 10 is an explanatory diagram illustrating an example of a configuration of a system including the semiconductor storage device according to the embodiment.

MODE FOR CARRYING OUT THE INVENTION

Figure 1:
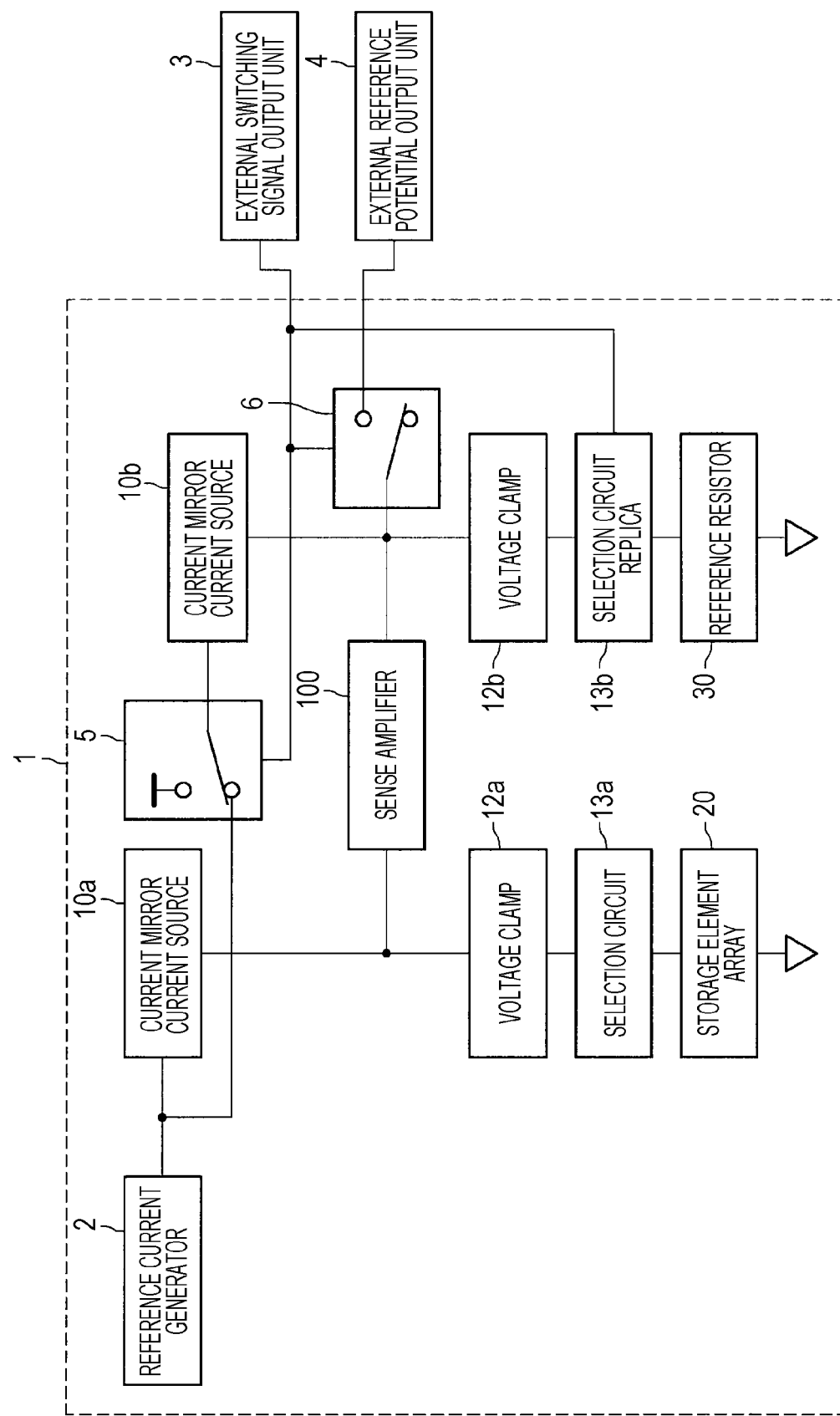
FIG. 1 is an explanatory diagram illustrating a semiconductor storage device according to an embodiment of the present disclosure, and components related to the semiconductor storage device.

Hereinafter, a preferred embodiment of the present disclosure will be described in detail with reference to the accompanying drawings. Note that in the present specification and the drawings, components having substantially the same functional configuration will be denoted by the same reference numerals, and redundant description will be omitted.

Note that descriptions will be provided in the following order.
1. Embodiment of Present Disclosure
1.1. Overview
1.2. Example of Configuration
2. Example of Application
3. Summary 1. Embodiment of Present Disclosure

[1.1. Overview]
Before describing an embodiment of the present disclosure, an overview of the embodiment of the present disclosure will be provided.

As described above, a variable-resistance semiconductor storage device includes a storage element constituted by at least one variable-resistance storage element which stores at least binary information on the basis of an electric resistance value. Further, the variable-resistance semiconductor storage device flows a current to a selected storage element and detects a value of a voltage applied to an electrical resistor of the storage element, by using a sense amplifier, to read a logical value stored in the storage element. In addition, the storage element of the variable-resistance semiconductor storage device has characteristics that when a voltage of a threshold or more is applied, a change to a high resistance or a low resistance occurs according to a direction of the applied voltage. Therefore, the variable-resistance semiconductor storage device requires reading at a voltage no higher than the threshold voltage.

Furthermore, there is a need to prepare, for reference, an intermediate value of two resistance values for identifying a resistance value of the storage element, and for example, a semiconductor storage device in which two storage elements having a high resistance value and a low resistance value, respectively, are arranged in parallel and an average value of the resistance values is obtained has been disclosed.

In a case where two storage elements having a high resistance value and a low resistance value, respectively, are arranged in parallel and the average value of the resistance values is obtained to generate a reference potential, the storage elements require a high reliability. Therefore, as described in Patent Documents 1 and 2 above, a technology of taking an average of the storage elements having the high resistance and the low resistance, respectively, to improve a reliability of the reference has been disclosed. However, a variation of the resistance value of the storage element cannot be avoided, and it is difficult to control the average value with high precision due to the storage element.

Furthermore, it is known that a read disturb phenomenon in which a value is changed by a current applied for reading, and a data retention error occur in the variable-resistance storage element with a certain probability, and there is a possibility that a reliability at the time of reading data is decreased in a case of using the variable-resistance storage element for reference.

Therefore, in light of the point described above, the present discloser has diligently studied a technology capable of setting a reference potential with a high reliability when reading data from a storage element, in particular, a variable-resistance storage element. As a result, the present discloser has come to devise a technology capable of setting a reference potential with a high reliability when reading data from a storage element, in particular, a variable-resistance storage element, as will be described later.

Hereinabove, the overview of the embodiment of the present disclosure has been described.

[1.2. Example of Configuration]
Next, an example of a functional configuration of a semiconductor storage device 1 according to the embodiment of the present disclosure will be described. FIG. 1 is an explanatory diagram illustrating the semiconductor storage device 1 according to the embodiment of the present disclosure, and components related to the semiconductor storage device 1. Hereinafter, the example of the functional configuration of the semiconductor storage device 1 according to the embodiment of the present disclosure will be described with reference to FIG. 1.

As illustrated in FIG. 1, the semiconductor storage device 1 according to the embodiment of the present disclosure includes a reference current generator 2, switches 5 and 6, current mirror current sources 10a and 10b, voltage clamps 12a and 12b, a selection circuit 13a, a selection circuit replica 13b, a storage element array 20, and a reference resistor 30. Furthermore, in FIG. 1, an external switching signal output unit 3 which outputs an external switching signal for performing switching of the switches 5 and 6, and an external reference potential output unit 4 which outputs a reference potential from the outside of the semiconductor storage device 1 are also illustrated.

The reference current generator 2 generates a reference current to be flowed to a storage element as a reading target in the storage element array 20 when reading data from the storage element array 20. The reference current generator 2 includes, for example, a constant current source and a transistor for forming a current mirror with the current mirror current sources 10a and 10b.

The current mirror current sources 10a and 10b form the current mirror with the reference current generator 2, and flow currents to the storage element as the reading target in the storage element array 20 and the reference resistor 30, respectively, when reading data from the storage element array 20.

The voltage clamps 12a and 12b limit voltages applied to the storage element as the reading target in the storage element array 20 and the reference resistor 30, respectively, when reading data from the storage element array 20.

The storage element array 20 includes variable-resistance storage elements arranged in a matrix form. The selection circuit 13a is a circuit which selects the storage element as the reading target in the storage element array 20 when reading data from the storage element array 20. The selection circuit replica 13b is a circuit connecting the reference resistor 30 and the current mirror current source 10b to each other when reading data from the storage element array 20.

The reference resistor 30 is a resistance element for applying the reference potential to a sense amplifier 100 when reading data from the storage element array 20. Note that an element which sets the reference potential may be a variable-resistance storage element.

The switch 5 is a switch configured to switch between connection and disconnection between the reference current generator 2 and the current mirror current source 10b. If the reference current generator 2 and the current mirror current source 10b are connected to each other, the reference current generator 2 and the current mirror current source 10b form the current mirror. Meanwhile, if the reference current generator 2 and the current mirror current source 10b are not connected to each other, the reference current generator 2 and the current mirror current source 10b do not form the current mirror. In other words, if the reference current generator 2 and the current mirror current source 10b are not connected to each other, the current is not supplied to the reference resistor 30. Accordingly, it can also be said that the switch 5 is a switch configured to switch supply and breaking of the current to the reference resistor 30. The switching between the supply and the breaking by the switch 5 is performed according to, for example, an output signal from the external switching signal output unit 3. Note that the switching between the supply and the breaking by the switch 5 may be performed by a power supply, rather than being performed according to a signal. In other words, while the semiconductor storage device 1 is incorporated into a product and a power is supplied, a state in which the reference current generator 2 and the current mirror current source 10b are connected to each other may be established.

In the following description, a state in which the reference current generator 2 and the current mirror current source 10b are connected to each other by the switch 5 is called a first state of the switch 5, and a state in which the reference current generator 2 and the current mirror current source 10b are disconnected from each other by the switch 5 is called a second state of the switch 5.

The switch 6 is a switch configured to switch between connection and disconnection between the sense amplifier 100 and the external reference potential output unit 4. If the sense amplifier 100 and the external reference potential output unit 4 are not connected to each other, the sense amplifier 100 inputs a potential output from the reference resistor 30 if the selection circuit replica 13b is in a connected state. Meanwhile, if the sense amplifier 100 and the external reference potential output unit 4 are connected to each other, the sense amplifier 100 inputs a reference potential output from the external reference potential output unit 4 if the selection circuit replica 13b is in a disconnected state.

In the following description, a state in which the sense amplifier 100 and the external reference potential output unit 4 are disconnected from each other by the switch 6 is called a first state of the switch 6, and a state in which the sense amplifier 100 and the external reference potential output unit 4 are connected to each other by the switch 6 is called a second state of the switch 6.

In other words, the semiconductor storage device 1 according to the embodiment of the present disclosure can perform switching between the potential generated by the reference resistor 30 and the potential output from the outside, as the reference potential used when reading data from the storage element array 20. Therefore, the semiconductor storage device 1 according to the embodiment of the present disclosure can use the potential generated by the reference resistor 30 as the reference potential in a case where a high speed is required in reading data, and can use the potential output from the external reference potential output unit 4 as the reference potential in a case where a high precision is required in reading data.

Hereinabove, the example of the functional configuration of the semiconductor storage device 1 according to the embodiment of the present disclosure has been described with reference to FIG. 1. Next, a specific example of a circuit configuration of the semiconductor storage device 1 according to the embodiment of the present disclosure will be described.

Figure 2:
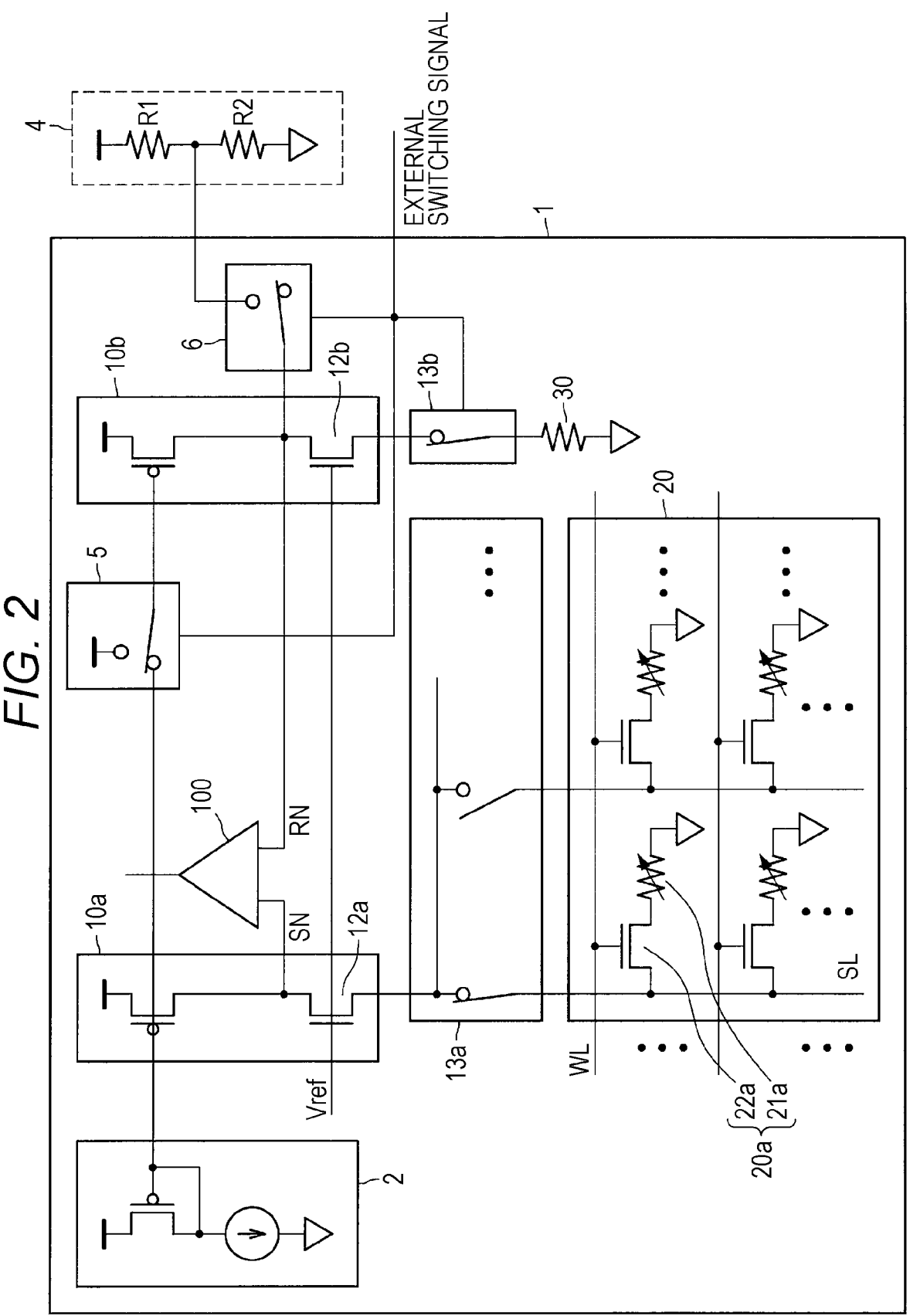
FIG. 2 is an explanatory diagram illustrating an example of a circuit configuration of the semiconductor storage device according to the embodiment.

FIG. 2 is an explanatory diagram illustrating an example of a circuit configuration of the semiconductor storage device 1 according to the embodiment of the present disclosure. In FIG. 2, the external reference potential output unit 4 which outputs the reference potential from the outside of the semiconductor storage device 1 is also illustrated, in addition to the semiconductor storage device 1. Hereinafter, the example of the circuit configuration of the semiconductor storage device 1 according to the embodiment of the present disclosure will be described with reference to FIG. 2.

The reference current generator 2 illustrated in FIG. 2 includes the constant current source and the transistor for forming the current mirror with the current mirror current sources 10a and 10b. The current mirror current sources 10a and 10b are each constituted by a transistor for forming the current mirror with the reference current generator 2.

The voltage clamps 12a and 12b are constituted by transistors for limiting voltages applied to the storage element as the reading target in the storage element array 20 and the reference resistor 30, respectively, when reading data from the storage element array 20.

The storage element array 20 includes storage elements 20a arranged in a matrix form. The storage element 20a includes a variable-resistance storage element 21a and a selection transistor 22a connected to the variable-resistance storage element 21a in series. The selection transistor 22a has a gate connected to a row selection line WL, a source connected to the source line SL, and a drain connected to the variable-resistance storage element 21a. The variable-resistance storage element 21a stores at least binary information on the basis of an electric resistance value.

When reading data from the storage element array 20, the storage element 20a as the reading target is selected. At this time, since the storage element 20a as the reading target is selected, the row selection line WL is first selected. After the row selection line WL is selected, as one switch in the selection circuit 13a is brought into a connected state, the storage element 20a as the reading target is selected. When the storage element 20a as the reading target is selected, a current is injected from the current mirror current source 10*a* into the selected storage element 20*a*. Due to the injection of the current, the voltage applied to the storage element 20*a* is amplified by the voltage clamp 12*a* and output to the sense amplifier 100.

In order to determine the voltage applied to the storage element 20*a*, a current is injected from the current mirror current source 10*b* into the reference resistor 30. Due to the injection of the current, the voltage applied to the reference resistor 30 is amplified by the voltage clamp 12*b* and output as the reference potential to the sense amplifier 100. Here, the semiconductor storage device 1 according to the embodiment of the present disclosure can use the potential generated by the external reference potential output unit 4 as the reference potential by switching the states of the switches 5 and 6.

In the following description, a state in which the current mirror current source 10*b* and the reference resistor 30 are connected to each other by the selection circuit replica 13*b* is called a first state of the selection circuit replica 13*b*, and a state in which the current mirror current source 10*b* and the reference resistor 30 are disconnected from each other by the selection circuit replica 13*b* is called a second state of the selection circuit replica 13*b*.

Note that in FIG. 2, two resistors R1 and R2 are illustrated as the external reference potential output unit 4. A potential set by a voltage division ratio of the resistors R1 and R2 is output to the semiconductor storage device 1.

Figure 3A:
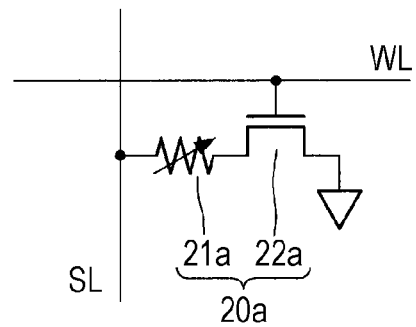
FIG. 3A is an explanatory diagram illustrating an example of a configuration of a storage element for data storage.
Figure 3B:
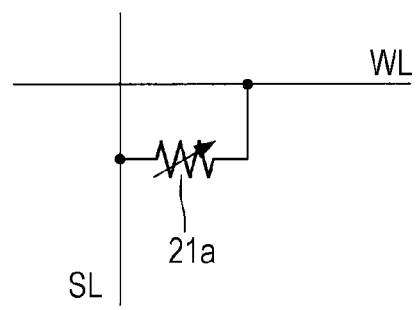
FIG. 3B is an explanatory diagram illustrating an example of a configuration of a storage element for data storage.

The storage element 20*a* can adopt various configurations and FIGS. 3A and 3B are explanatory diagrams illustrating examples of a configuration of the storage element 20*a* for data storage. The variable-resistance storage element 21*a* may be provided between the source line SL and the selection transistor 22*a* as illustrated in FIG. 3A or between the source line SL and the row selection line WL as illustrated in FIG. 3B.

In a case where the storage elements for reference are used as elements which set the reference potential, one of the storage elements may be a storage element in which a logical value "0" is written, and the other one of the storage elements may be a storage element in which a logical value "1" is written. Further, in a case where the variable-resistance storage elements are used as the storage elements for reference, one of the variable-resistance storage elements is in a high resistance (RH) state, and the other one is in a low resistance (RL) state. Further, as the storage elements are connected to each other in parallel, an average of values of the storage elements is used as a reference. FIGS. 4A to 4F are explanatory diagrams illustrating examples of a configuration of the storage element for reference. The storage element for reference may have a configuration of any one of FIGS. 4A to 4F, or other various configurations.

Figure 4A:
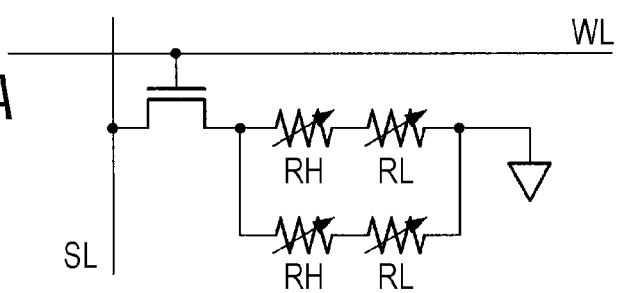
FIG. 4A is an explanatory diagram illustrating an example of a configuration of a storage element for reference.
Figure 4B:
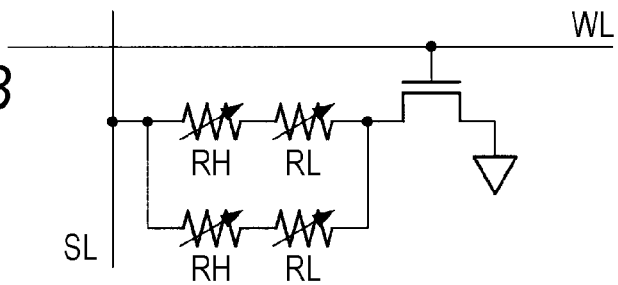
FIG. 4B is an explanatory diagram illustrating an example of a configuration of a storage element for reference.
Figure 4C:
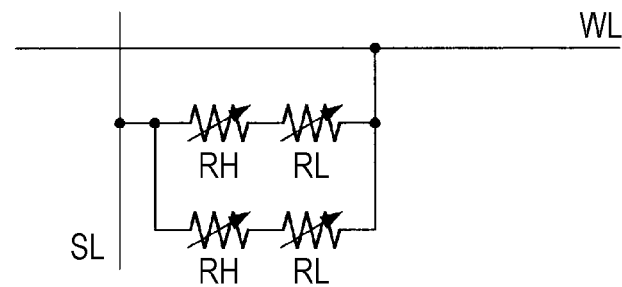
FIG. 4C is an explanatory diagram illustrating an example of a configuration of a storage element for reference.

FIGS. 4A to 4C illustrate examples of a configuration in a case where two sets of two variable-resistance storage elements connected to one another in series are arranged in parallel to one another to generate the reference potential. One of the variable-resistance storage elements connected to each other in series has a high resistance and the other one has a low resistance. Accordingly, two variable-resistance storage elements in a high resistance state and two variable-resistance storage elements in a low resistance state as a whole generate the reference potential. A difference among the configurations illustrated in FIGS. 4A to 4C is a position of the selection transistor or a presence or absence of the selection transistor.

Figure 4D:
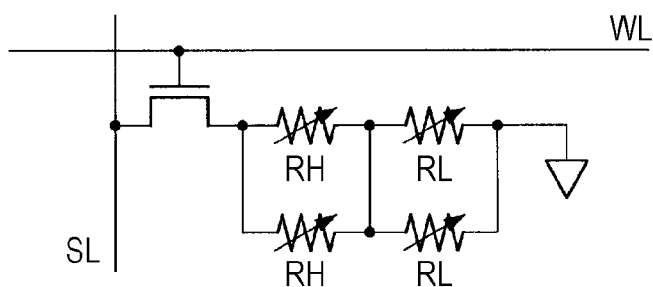
FIG. 4D is an explanatory diagram illustrating an example of a configuration of a storage element for reference.
Figure 4E:
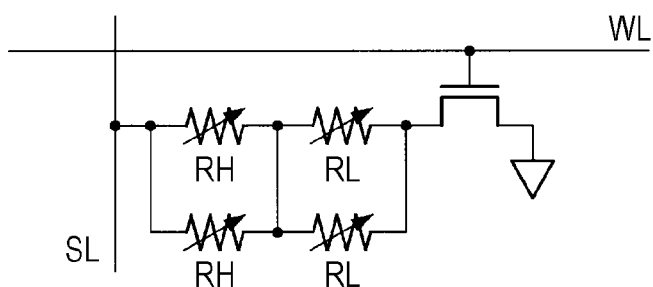
FIG. 4E is an explanatory diagram illustrating an example of a configuration of a storage element for reference.
Figure 4F:
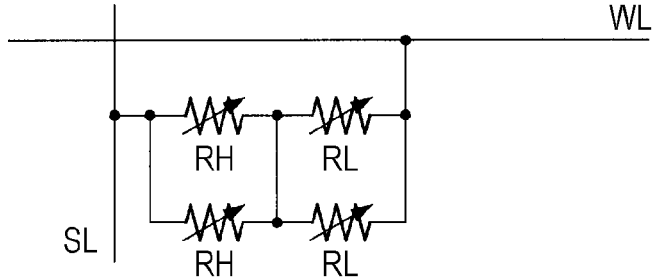
FIG. 4F is an explanatory diagram illustrating an example of a configuration of a storage element for reference.

FIGS. 4D to 4F illustrate examples of a configuration in a case where two sets of two variable-resistance storage elements connected to one another in parallel are connected to one another in series to generate the reference potential. One of the variable-resistance storage elements connected to each other in series has a high resistance and the other one has a low resistance. Accordingly, two variable-resistance storage elements in a high resistance state and two variable-resistance storage elements in a low resistance state as a whole generate the reference potential. A difference among the configurations illustrated in FIGS. 4D to 4F is a position of the selection transistor or a presence or absence of the selection transistor.

Figure 4G:
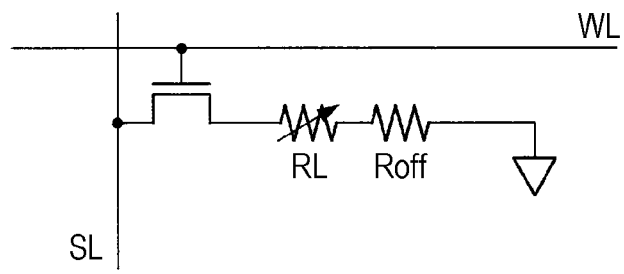
FIG. 4G is an explanatory diagram illustrating an example of a configuration of a storage element for reference.
Figure 4H:
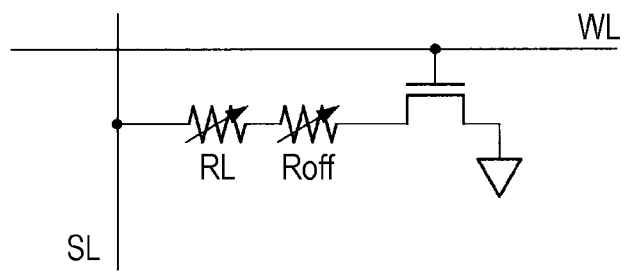
FIG. 4H is an explanatory diagram illustrating an example of a configuration of a storage element for reference.
Figure 4I:
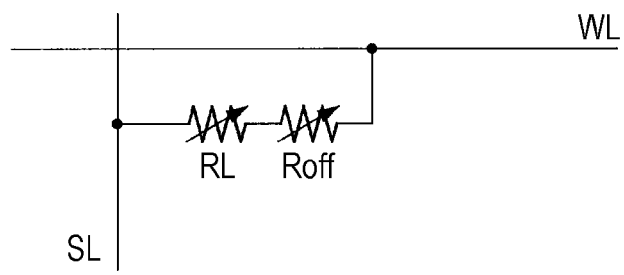
FIG. 4I is an explanatory diagram illustrating an example of a configuration of a storage element for reference.

Furthermore, as the storage element for reference, a series combination of a variable-resistance storage element in a low resistance state and another resistor may be used. FIGS. 4G to 4I are explanatory diagrams illustrating examples of a configuration of the storage element for reference. A difference among the configurations illustrated in FIGS. 4G to 4I is a position of the selection transistor or a presence or absence of the selection transistor.

Figure 5:
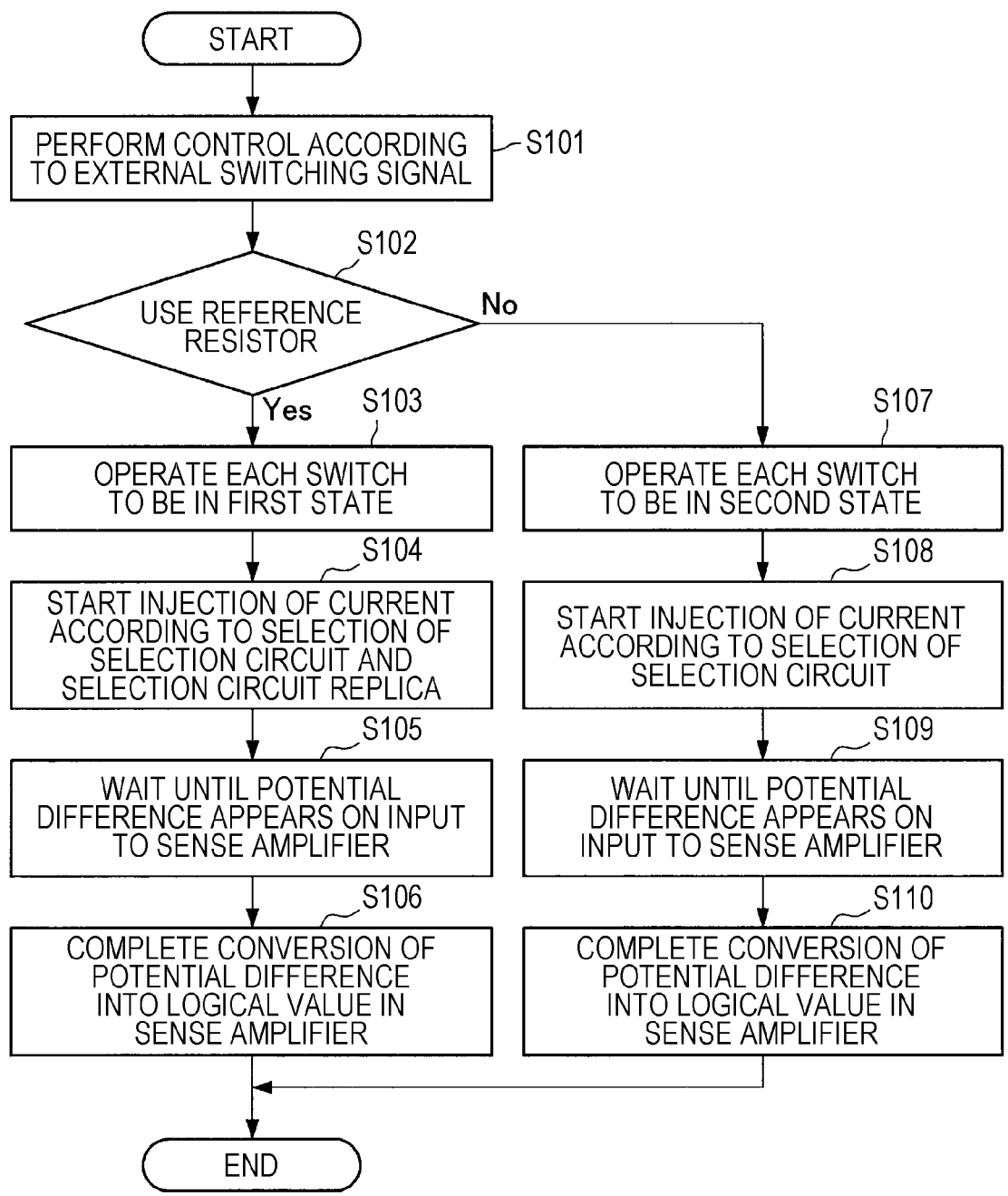
FIG. 5 is a flowchart illustrating an example of an operation of the semiconductor storage device according to the embodiment.

Next, an example of an operation of the semiconductor storage device 1 according to the embodiment of the present disclosure will be described. FIG. 5 is a flowchart illustrating the example of the operation of the semiconductor storage device 1 according to the embodiment of the present disclosure. FIG. 5 illustrates the example of the operation of the semiconductor storage device 1, in which whether to use the potential generated in the semiconductor storage device 1 or the potential output from the outside, as the reference potential is determined to perform a data reading process. Hereinafter, the example of the operation of the semiconductor storage device 1 according to the embodiment of the present disclosure will be described with reference to FIG. 5.

The semiconductor storage device 1 performs a control of switching the switches 5 and 6 according to a signal from the external switching signal output unit 3 (step S101). For example, whether or not to use the reference resistor 30 as the reference potential is determined in a processor provided outside the semiconductor storage device 1 (step S102), and in a case where the reference resistor 30 is used as the reference potential (Yes in step S102), the semiconductor storage device 1 operates both of the switches 5 and 6 to be in the first state (step S103). Thereafter, the semiconductor storage device 1 starts injection of a current into the storage element 20*a* and the reference resistor 30 according to selection of the selection circuit 13*a* and the selection circuit replica 13*b* (step S104). When the current is injected into the storage element 20*a* and the reference resistor 30, the semiconductor storage device 1 then waits until a potential difference between a potential appearing on a sense node SN, and a potential appearing on a reference node RN appears on an input to the sense amplifier 100 (step S105). Then, the semiconductor storage device 1 completes conversion of the potential difference into a logical value in the sense amplifier 100 (step S106).

Meanwhile, in a case where the reference resistor 30 is not used as the reference potential, in other words, in a case where the potential from the outside is used (No in step S102), the semiconductor storage device 1 operates both of the switches 5 and 6 to be in the second state and at the same time, operates the selection circuit replica 13*b* to be in the second state (step S107). Thereafter, the semiconductor storage device 1 starts injection of a current into the storage element 20*a* according to selection of the selection circuit 13*a* (step S108). When the current is injected into the storage element 20*a*, the semiconductor storage device 1 then waits until a potential difference between a potential appearing on the sense node SN, and the potential (in other words, the potential output from the external reference potential output unit 4) appearing on the reference node RN appears on the input to the sense amplifier 100 (step S109). Then, the semiconductor storage device 1 completes conversion of the potential difference into a logical value in the sense amplifier 100 (step S110).

The semiconductor storage device 1 according to the embodiment of the present disclosure can use any one of the potential generated by using the reference resistor 30 inside the semiconductor storage device 1 and the potential provided from the outside, as the reference potential used when reading data from the storage element 20a by performing such a series of operations.

Note that in the example described above, the switches 5 and 6, and the selection circuit replica 13b are switched to the first state or the second state, but the present disclosure is not limited to the example.

For example, the external switching signal output unit 3 may output a signal for switching only the switch 5 to the first state and switching the switch 6 and the selection circuit replica 13b to the second state. As only the switch 5 is in the first state and the switch 6 and the selection circuit replica 13b are in the second state, the semiconductor storage device 1 can use a resistance element with a high precision formed outside the semiconductor storage device 1 as the resistance element for reference.

Furthermore, for example, the external switching signal output unit 3 may output a signal for switching only the switch 6 to the second state and switching the switch 5 and the selection circuit replica 13b to the first state. As only the switch 6 is in the second state and the switch 5 and the selection circuit replica 13b are in the first state, the semiconductor storage device 1 can output a voltage value generated by the reference resistor 30 to the outside. As the voltage value generated by the reference resistor 30 is output from the semiconductor storage device 1, the processor or the like outside the semiconductor storage device 1 can monitor the voltage value.

Figure 6:
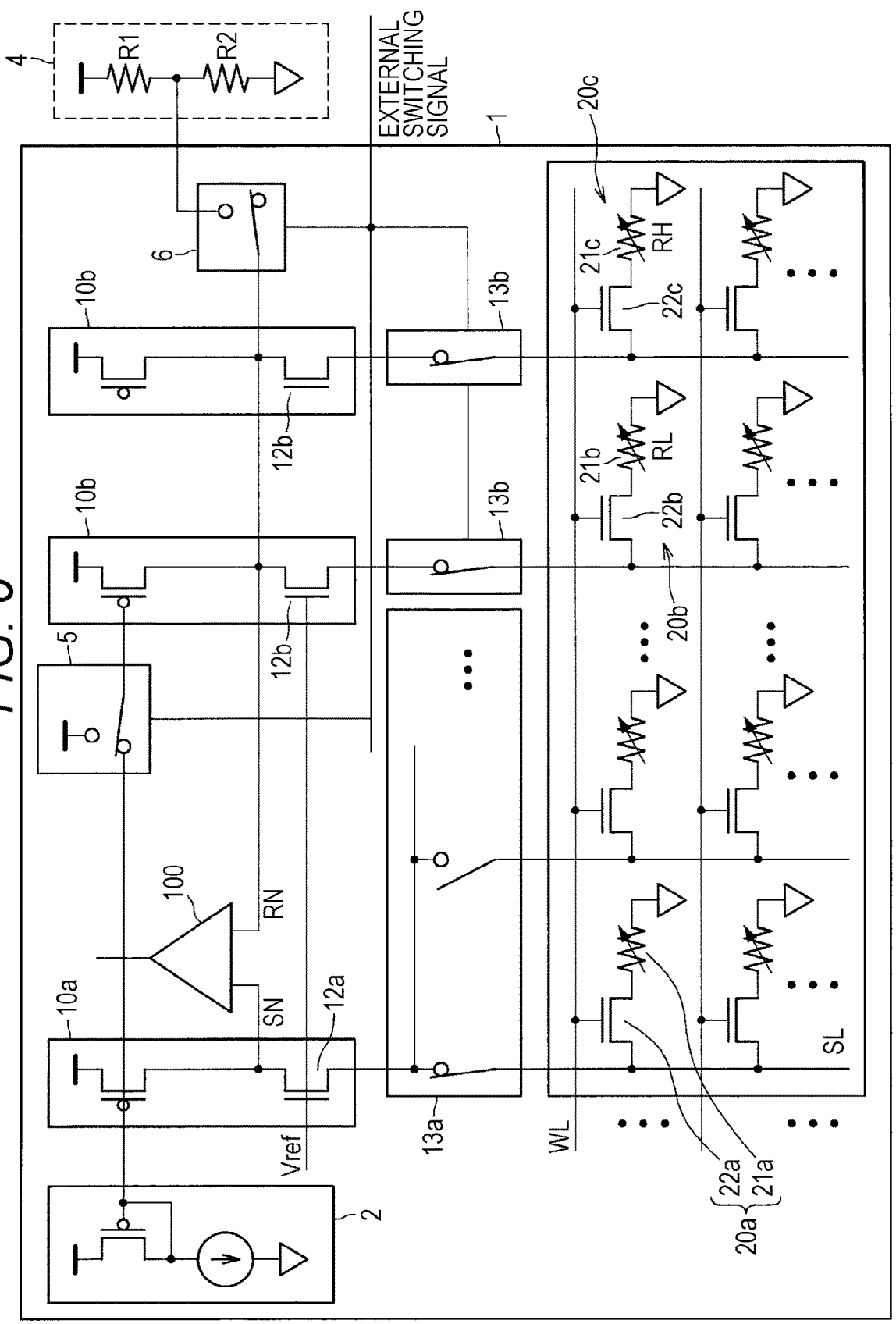
FIG. 6 is an explanatory diagram illustrating another example of the circuit configuration of the semiconductor storage device according to the embodiment.

FIG. 6 is an explanatory diagram illustrating another example of the circuit configuration of the semiconductor storage device 1 according to the embodiment of the present disclosure. As described above, in a case where the storage elements for reference are used as elements which set the reference potential, one of the storage elements may be a storage element 20b in which a logical value "0" is written, and the other one of the storage elements may be a storage element 20c in which a logical value "1" is written. The storage element 20b has a configuration in which a variable-resistance storage element 21b and a selection transistor 22b are connected to each other in series. Similarly, the storage element 20c has a configuration in which a variable-resistance storage element 21c and a selection transistor 22c are connected to each other in series. Then, the storage elements 20b and 20c may be provided in the same array as the storage element array 20 as illustrated in FIG. 6 or may be provided in a different array.

A resistor of at least 1 bit, which retains at least two states, may be provided between the external switching signal output unit 3, and the switches 5 and 6 and the selection circuit replica 13b. In other words, the state may be switched according to the outputs from the switches 5 and 6, the selection circuit replica 13b, and the resistor. Then, a control by the resistor can be performed before an operation of reading data from the storage element array 20.

2. Example of Application

One or a plurality of semiconductor storage devices 1 according to the embodiment of the present disclosure may be incorporated into the same semiconductor device as that of a control circuit which controls the semiconductor storage device 1, or may be incorporated into a semiconductor device different from that of the control circuit which controls the semiconductor storage device 1. FIGS. 7 to 10 are explanatory diagrams illustrating examples of a configuration of a system including the semiconductor storage device 1 according to the embodiment of the present disclosure.

Figure 7:
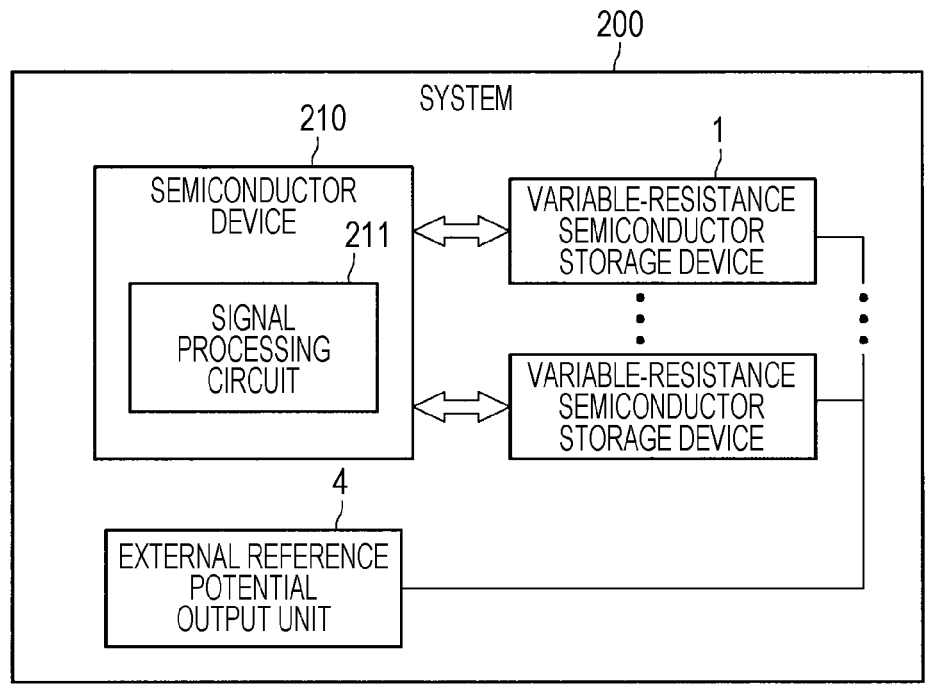
FIG. 7 is an explanatory diagram illustrating an example of a configuration of a system including the semiconductor storage device according to the embodiment.

The example illustrated in FIG. 7 is an example in which the semiconductor storage device 1 is connected to a semiconductor device 210 including a signal processing circuit 211, and further, the external reference potential output unit 4 is provided outside the semiconductor device 210. The signal processing circuit 211 is a circuit which generates a signal for reading and writing data from and in the semiconductor storage device 1.

Figure 8:
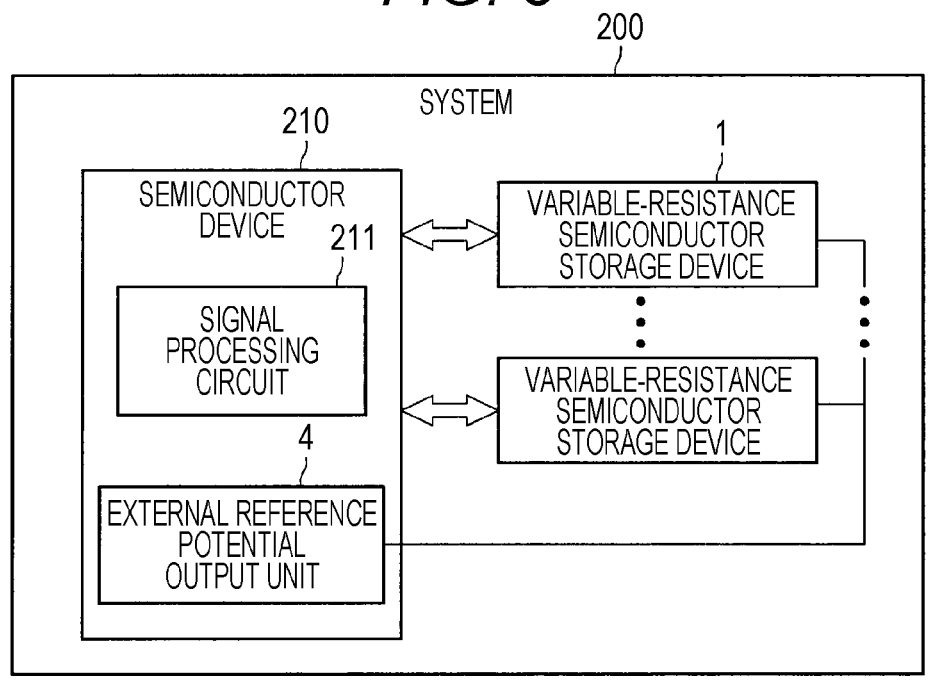
FIG. 8 is an explanatory diagram illustrating an example of a configuration of a system including the semiconductor storage device according to the embodiment.

The example illustrated in FIG. 8 is an example in which the semiconductor storage device 1 is connected to the semiconductor device 210 including the signal processing circuit 211, and further, the external reference potential output unit 4 is provided in the semiconductor device 210.

The example illustrated in FIG. 9 is an example in which the semiconductor storage device 1 is provided in the semiconductor device 210 including the signal processing circuit 211, and further, the external reference potential output unit 4 is provided outside the semiconductor device 210.

The example illustrated in FIG. 10 is an example in which the semiconductor storage device 1 is provided in the semiconductor device 210 including the signal processing circuit 211, and further, the external reference potential output unit 4 is provided in the semiconductor device 210.

Then, the semiconductor storage device 1 according to the embodiment of the present disclosure can be mounted on various electronic devices. The electronic devices on which the semiconductor storage device 1 according to the embodiment of the present disclosure can be mounted include a smartphone, a table terminal, a digital still camera, a digital video camera, a music player, a set-top box, a computer, a television, a clock, an active speaker, a headset, a game machine, a radio, measuring instrument, an electronic tag, a beacon, and the like.

Figure 11:
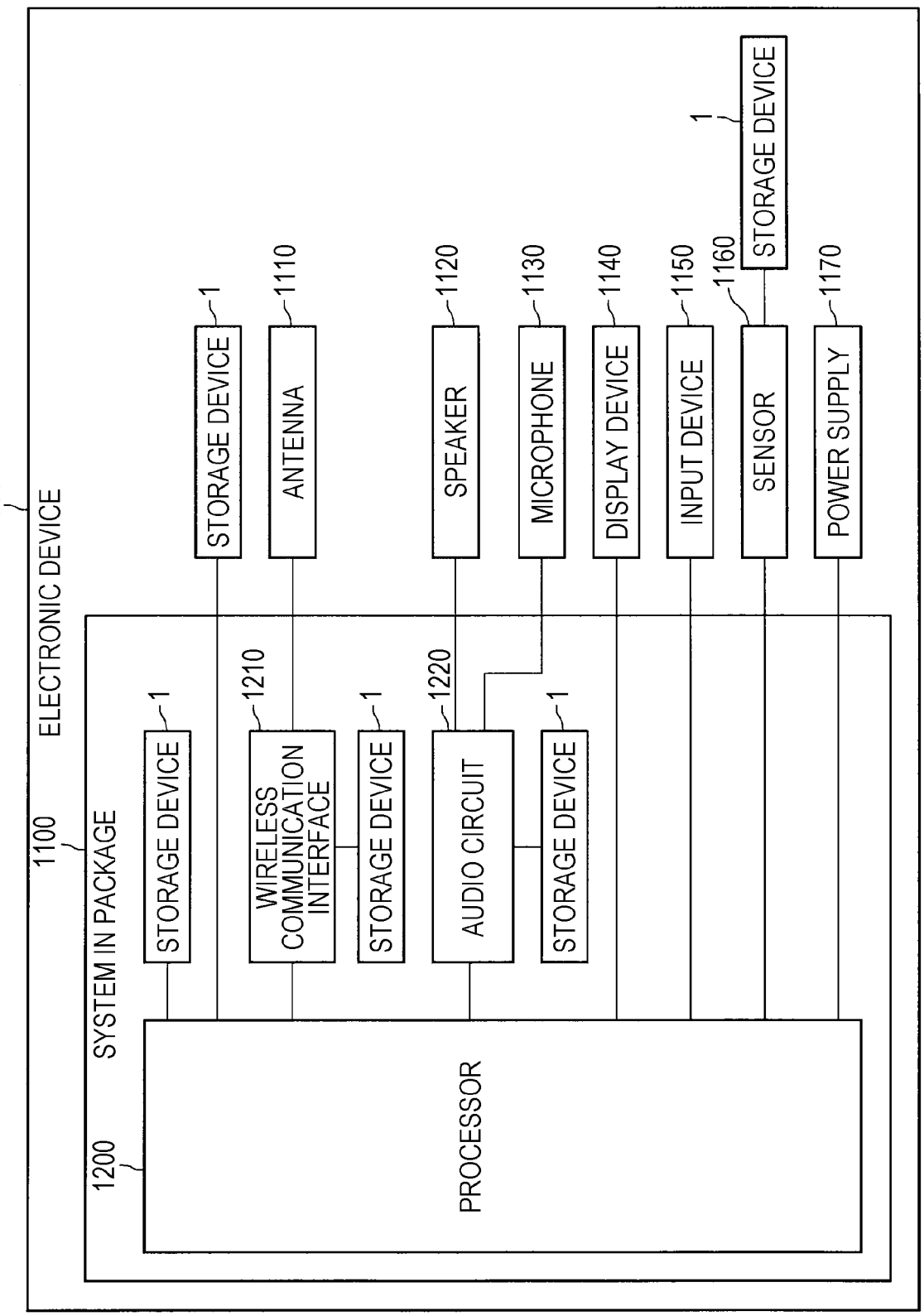
FIG. 11 is an explanatory diagram illustrating an example of a functional configuration of an electronic device on which the semiconductor storage device according to the embodiment can be mounted.

FIG. 11 is an explanatory diagram illustrating an example of a functional configuration of an electronic device 1000 on which the semiconductor storage device 1 according to the embodiment of the present disclosure can be mounted. The electronic device 1000 illustrated in FIG. 11 includes a system in package 1100, an antenna 1110, a speaker 1120, a microphone 1130, a display device 1140, an input device 1150, a sensor 1160, and a power supply 1170. Furthermore, the system in package 1100 includes a processor 1200, a wireless communication interface 1210, and an audio circuit 1220.

The antenna 1110 is an antenna for performing mobile communication, wireless LAN, or short-range communication, and is connected to the wireless communication interface 1210. The speaker 1120 outputs a sound and is connected to the audio circuit 1220. The microphone 1130 collects an ambient sound around the electronic device 1000 and is connected to the audio circuit 1220.

The display device 1140 is configured by, for example, a liquid crystal display, an organic EL display, a light emitting diode (LED) indicator, or the like, and is connected to the processor 1200. The input device 1150 is configured by, for example, a keyboard, a button, a touch panel, or the like, and is connected to the processor 1200.

The sensor 1160 has a function of an optical sensor, a position sensor, an acceleration sensor, a biosensor, a magnetic sensor, a mechanical sensor, a heat sensor, an electric sensor, a chemical sensor, or the like. The variable-resistance semiconductor storage device 1 according to the embodiment of the present disclosure may be connected to the sensor 1160. The power supply 1170 supplies power to the electronic device 1000, and is, for example, a power supply which supplies power from a battery, an AC adaptor, or the like.

The processor 1200 is an electronic circuit for controlling an operation of the electronic device 1000, and the variable-resistance semiconductor storage device 1 according to the embodiment of the present disclosure may be connected inside the system in package 1100 or outside the system in package 1100.

The wireless communication interface 1210 has a function such as the mobile communication, the wireless LAN, or the short range communication. The variable-resistance semiconductor storage device 1 according to the embodiment of the present disclosure may be connected to the wireless communication interface 1210. The audio circuit 1220 has a function of controlling the speaker 1120 and the microphone 1130, and the variable-resistance semiconductor storage device 1 according to the embodiment of the present disclosure may be connected to the audio circuit 1220.

As the variable-resistance semiconductor storage device 1 according to the embodiment of the present disclosure is mounted on such an electronic device 1000, it is possible to set a reference potential with a high reliability, and thus it is possible to improve reliability at the time of reading data.

3. Summary

As described above, according to the embodiment of the present disclosure, the semiconductor storage device 1 which can use any one of the reference potential generated in the semiconductor storage device 1 and the reference potential provided from the outside, as the reference potential used when reading data from the storage element, is provided.

The semiconductor storage device 1 according to the embodiment of the present disclosure uses any one of the reference potential generated in the semiconductor storage device 1 and the reference potential generated outside, such that the reference potential generated in the semiconductor storage device 1 can be used in a case of reading data from the storage element at a high speed, the reference potential generated outside can be used in a case of reading data from the storage element with a high reliability.

Furthermore, the semiconductor storage device 1 according to the embodiment of the present disclosure can use the reference potential generated outside to perform reading of data from the storage element using the reference potential without being affected by a variation of the storage element, a read disturb, and a data retention error. Accordingly, the semiconductor storage device 1 according to the embodiment of the present disclosure is suitable for construction of a system according to a required reliability.

The semiconductor storage device 1 according to the embodiment of the present disclosure can be a variable-resistance semiconductor storage device, for example, a spin-random access memory (spin-RAM).

Hereinabove, the preferred embodiment of the present disclosure has been described in detail with reference to the accompanying drawings, but the technical scope of the present disclosure is not limited to such examples. It is obvious that those having ordinary knowledge in the technical field of the present disclosure can conceive of various modifications or alterations within the scope of the technical idea described in the claims, and it is understood that the modifications or alterations naturally fall within the technical scope of the present disclosure.

Furthermore, the effects described in the present specification are merely illustrative or exemplary, and not limiting. That is, the technology according to the present disclosure may achieve other effects apparent to those skilled in the art from the description of the present specification, in addition to or instead of the effects described above.

Note that the following configurations also fall within the technical scope of the present disclosure.

(1)

A semiconductor storage device including:

a resistance element configured to generate a reference potential to be supplied to a sense amplifier; and a switch unit having at least two states including a state in which the reference potential to be supplied to the sense amplifier is generated by injection of a current into the resistance element, and a state in which a reference potential generated outside the semiconductor storage device is supplied to the sense amplifier.

(2)

The semiconductor storage device according to (1), in which the switch unit includes:

a first switch having two states in which whether or not to perform injection of a current from a current source for generating the reference potential to be supplied to the sense amplifier by the injection of the current into the resistance element is controlled, and a second switch having two states in which whether or not to perform supply of the reference potential generated outside the semiconductor storage device to the sense amplifier is controlled.

(3)

The semiconductor storage device according to (1) or (2), in which the states of the switch unit are switched according to a signal from outside the semiconductor storage device.

(4)

The semiconductor storage device according to any one of (1) to (3), in which the reference potential is generated by a first resistance element in a first resistance state and a second resistance element in a second resistance state different from the first resistance state.

(5)

The semiconductor storage device according to (4), in which the first resistance element and the second resistance element include variable-resistance memory elements.

(6)

The semiconductor storage device according to (4), in which the first resistance element and the second resistance element include variable-reluctance memory elements.

(7)

An information processing apparatus including at least one semiconductor storage device according to any one of (1) to (4).

(8)

A reference potential setting method including:

switching between at least two states including a state in which a reference potential to be supplied to a sense amplifier is generated by injection of a current into a resistance element, and a state in which a reference potential generated outside a semiconductor storage device is supplied to the sense amplifier, the resistance element being configured to generate the reference potential to be supplied to the sense amplifier.

REFERENCE SIGNS LIST

1 Semiconductor storage device
2 Reference current generator
3 External switching signal output unit
4 External reference potential output unit
5 Switch
6 Switch
10a Current mirror current source
10b Current mirror current source
12a Voltage clamp
12b Voltage clamp
13a Selection circuit
13b Selection circuit replica
20 Storage element array
20a Storage element
20b Storage element
20c Storage element
21a Variable-resistance storage element
21b Variable-resistance storage element
21c Variable-resistance storage element
22a Selection transistor
22b Selection transistor
22c Selection transistor
30 Reference resistor
100 Sense amplifier
210 Semiconductor device
211 Signal processing circuit
R1 Resistor
R2 Resistor
RN Reference node
SL Source line
SN Sense node
WL Row selection line

The invention claimed is:

1. A semiconductor storage device comprising:
a resistance element configured to generate a first reference potential to be supplied to a reference node of a sense amplifier; and
a switch unit having at least two states including a first state in which the first reference potential to be supplied to the reference node of the sense amplifier is generated by injection of a current into the resistance element, and a second state in which a second reference potential generated by an external unit outside the semiconductor storage device is supplied to the reference node of the sense amplifier.

2. The semiconductor storage device according to claim 1, wherein the switch unit includes:
a first switch including two states that control whether to inject a current from a current source into the resistance element to generate the first reference potential to be supplied to the reference node of the sense amplifier, and
a second switch including two states that control whether to supply the second reference potential generated outside the semiconductor storage device to the reference node of the sense amplifier.

3. The semiconductor storage device according to claim 1, wherein the states of the switch unit are switched according to a signal from outside the semiconductor storage device.

4. The semiconductor storage device according to claim 1, wherein the first reference potential is generated by a first resistance element in a first resistance state and a second resistance element in a second resistance state that is different from the first resistance state.

5. The semiconductor storage device according to claim 4, wherein the first resistance element and the second resistance element include variable-resistance memory elements.

6. The semiconductor storage device according to claim 4, wherein the first resistance element and the second resistance element include variable-reluctance memory elements.

7. A reference potential setting method comprising:
switching between at least two states including a first state in which a first reference potential to be supplied to a reference node of a sense amplifier is generated by injection of a current into a resistance element, and a second state in which a second reference potential generated by an external unit outside a semiconductor storage device is supplied to the reference node of the sense amplifier.

8. The reference potential setting method according to claim 7, wherein the first reference potential is generated by a first resistance element in a first resistance state and a second resistance element in a second resistance state that is different from the first resistance state.

9. The reference potential setting method according to claim 8, wherein the first resistance element and the second resistance element include variable-resistance memory elements.

10. The reference potential setting method according to claim 8, wherein the first resistance element and the second resistance element include variable-reluctance memory elements.

11. An information processing apparatus comprising at least one semiconductor storage device according to claim 1.

12. The information processing apparatus according to claim 11, wherein the switch unit includes:
a first switch including two states that control whether to inject a current from a current source into the resistance element to generate the first reference potential to be supplied to the reference node of the sense amplifier, and
a second switch including two states that control whether to supply the second reference potential generated outside the semiconductor storage device to the reference node of the sense amplifier.

13. The information processing apparatus according to claim 11, wherein the states of the switch unit are switched according to a signal from outside the semiconductor storage device.

14. The information processing apparatus according to claim 11, wherein the first reference potential is generated by a first resistance element in a first resistance state and a second resistance element in a second resistance state that is different from the first resistance state.

15. The information processing apparatus according to claim 14, wherein the first resistance element and the second resistance element include variable-resistance memory elements.

16. The information processing apparatus according to claim 14, wherein the first resistance element and the second resistance element include variable-reluctance memory elements.

* * * * *